United States Patent
Morozumi et al.

(10) Patent No.: US 8,573,751 B2
(45) Date of Patent: Nov. 5, 2013

(54) PIEZOELECTRIC ELEMENT, LIQUID EJECTING HEAD, AND LIQUID EJECTING APPARATUS

(75) Inventors: Koichi Morozumi, Shiojiri (JP); Toshiki Hara, Suwa (JP); Jiro Kato, Suwa (JP); Satoshi Denda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 148 days.

(21) Appl. No.: 12/880,283

(22) Filed: Sep. 13, 2010

(65) Prior Publication Data

US 2011/0063376 A1    Mar. 17, 2011

(30) Foreign Application Priority Data

Sep. 14, 2009  (JP) ................. 2009-211435

(51) Int. Cl.
*B41J 2/045*  (2006.01)
*H01L 41/18*  (2006.01)
*C04B 35/00*  (2006.01)

(52) U.S. Cl.
USPC ............. 347/68; 310/365; 252/62.9 PZ

(58) Field of Classification Search
USPC ............................. 252/62.9 PZ
See application file for complete search history.

(56) References Cited

U.S. PATENT DOCUMENTS 5,719,607 A * 2/1998 Hasegawa et al. ......... 347/70
6,328,433 B1 * 12/2001 Moriya et al. ............. 347/68
6,705,708 B2   3/2004 Murai

FOREIGN PATENT DOCUMENTS

JP       06021337 A  *  1/1994
JP     2000082786 A  *  3/2000
JP     2002-314163      10/2002

OTHER PUBLICATIONS

Machine Translation of JP 2000082786A.*
Machine Translation of JP 06021337A, Paragraphs 227-28, 56-57, and 69.*

* cited by examiner

*Primary Examiner* — Lisa M Solomon
(74) *Attorney, Agent, or Firm* — Workman Nydegger

(57) ABSTRACT

A piezoelectric element includes a first conductive layer, a second conductive layer disposed to face the first conductive layer, and a piezoelectric layer disposed between the first conductive layer and the second conductive layer and composed of a compound oxide containing at least lead, zirconium, titanium, and oxygen. The piezoelectric layer includes a lead concentration gradient region in which the lead concentration increases from the first conductive layer side to the second conductive layer side. The lead concentration gradient region is disposed on the first conductive layer side of the piezoelectric layer.

7 Claims, 10 Drawing Sheets

EXPERIMENTAL EXAMPLE 1

EXPERIMENTAL EXAMPLE 2

EXPERIMENTAL EXAMPLE 1

EXPERIMENTAL EXAMPLE 2

REFERENCE EXAMPLE

PIEZOELECTRIC ELEMENT, LIQUID EJECTING HEAD, AND LIQUID EJECTING APPARATUS

BACKGROUND

1. Technical Field

The present invention relates to a piezoelectric element, a liquid ejecting head, and a liquid ejecting apparatus.

2. Related Art

Piezoelectric elements have a structure in which a piezoelectric material composed of a crystallized piezoelectric ceramic or the like is interposed between two electrodes. Therefore, the piezoelectric elements can exhibit deformations such as expansion and contraction or the like by applying an electric field to the piezoelectric material. The piezoelectric elements are used as piezoelectric actuators of liquid ejecting heads and the like. A typical example of the piezoelectric actuators used for liquid ejecting heads is one driven in a flexural vibration mode.

An example of the liquid ejecting heads is an ink jet recording head or the like including a vibrating plate which constitutes a portion of a pressure-generating chamber communicated with a nozzle orifice which ejects ink droplets so that the vibrating plate is deformed by a piezoelectric element to apply pressure to ink introduced into the pressure-generating chamber, ejecting ink droplets from the nozzle orifice. The piezoelectric actuator provided on the ink jet recording head is formed by, for example, forming a uniform piezoelectric material layer over the entire surface of the vibrating plate and cutting the piezoelectric material layer in a shape corresponding to the pressure-generating chamber by lithography so that the actuator can be driven independently for each pressure-generating chamber.

In addition, the piezoelectric layers of such piezoelectric elements are formed by depositing thin films of a piezoelectric material such as lead zirconate titanate (PZT) or the like using a liquid phase process. For example, Japanese Unexamined Patent Application Publication No. 2002-314163 discloses a method for forming films by applying a piezoelectric material multiple times to form a piezoelectric layer. This publication describes that this film forming method can stably form a piezoelectric layer (engineered domain) with preferential orientation of (100) crystal plane in a direction normal to a substrate surface.

However, the performance required for piezoelectric elements becomes more strict, and it becomes difficult to achieve sufficient performance only by applying a piezoelectric material multiple times to form a piezoelectric layer. Therefore, for example, lattice matching between an electrode material and a piezoelectric layer, further lamination of another material (e.g., titanium), and the like are being investigated.

The inventors have found that in order to form a better engineered domain structure, it is important to suppress deterioration of crystals of a piezoelectric material near an interface between a piezoelectric layer and an electrode. It has been also found that the composition of the piezoelectric material greatly affects the control of crystals of the piezoelectric material near an interface between the piezoelectric layer and electrodes which hold the piezoelectric layer therebetween.

SUMMARY

An advantage of some aspects of the invention is that the invention provides a piezoelectric element having good piezoelectric characteristics and good crystal quality in a piezoelectric layer and near the interfaces with electrodes which hold the piezoelectric layer therebetween.

The invention has been achieved for resolving at least part of the above-mentioned problems and can be realized as embodiments or application examples described below.

APPLICATION EXAMPLE 1

A piezoelectric element according to an embodiment of the present invention includes a first conductive layer, a second conductive layer disposed to face the first conductive layer, and a piezoelectric layer disposed between the first conductive layer and the second conductive layer and composed of a compound oxide containing at least lead, zirconium, titanium, and oxygen. The piezoelectric layer includes a lead concentration gradient region in which the lead concentration increases from the first conductive layer side to the second conductive layer side. The lead concentration gradient region is disposed on the first conductive layer side of the piezoelectric layer.

In this piezoelectric element, the lead composition in the compound oxide which constitutes the piezoelectric layer is gradient in a position on the first conductive layer side. Therefore, the crystal quality of the compound oxide is improved near the interface between the piezoelectric layer and the first conductive layer. Thus, the piezoelectric element of this application example has good durability characteristics with respect to at least a displacement.

APPLICATION EXAMPLE 2

A piezoelectric element according to an embodiment of the present invention includes a first conductive layer, a second conductive layer disposed to face the first conductive layer, and a piezoelectric layer disposed between the first conductive layer and the second conductive layer and composed of a compound oxide containing at least lead, zirconium, titanium, and oxygen. The piezoelectric layer includes two lead concentration gradient regions in which the lead concentration increases from the first conductive layer side to the second conductive layer side. One of the lead concentration gradient regions is disposed on the first conductive layer side of the piezoelectric layer, and the other lead concentration gradient region is disposed on the second conductive layer side of the piezoelectric layer.

In this piezoelectric element, the lead composition in the compound oxide which constitutes the piezoelectric layer is gradient in positions on the first conductive layer side and the second conductive layer side. Therefore, the crystal quality of the compound oxide is improved near the interfaces between the piezoelectric layer and the first conductive layer and the second conductive layer. Thus, the piezoelectric element of this application example has good durability characteristics with respect to at least a displacement.

APPLICATION EXAMPLE 3

In the piezoelectric element of application example 1 or 2, the difference in lead concentration between the first conductive layer side of the lead concentration gradient region and the second conductive layer side of the lead concentration gradient region is 0.8 atomic % or more and 1.8 atomic % or less.

This piezoelectric element has a good lead concentration distribution in the lead concentration gradient regions, good durability characteristics, and a good electric field distribution when an electric field is applied by the first conductive layer and the second conductive layer.

APPLICATION EXAMPLE 4

In the piezoelectric element of any one of application examples 1 to 3, the lead concentration gradient in the lead concentration gradient region is 0.006 atomic %/nm or more and 0.014 atomic %/nm or less.

This piezoelectric element has a good lead concentration distribution in the lead concentration gradient regions and good durability characteristics and a good electric field distribution when an electric field is applied by the first conductive layer and the second conductive layer.

APPLICATION EXAMPLE 5

In the piezoelectric element of any one of application examples 1 to 4, the lead concentration in the piezoelectric layer is measured using a relative sensitivity factor determined by both Rutherford backscattering spectroscopy and Auger electron spectroscopy.

This piezoelectric element has a good lead concentration gradient in the lead concentration gradient region and good durability characteristics.

APPLICATION EXAMPLE 6

In the piezoelectric element of any one of application examples 1 to 5, the lead concentration gradient region has a layer shape, and the thickness of the lead concentration gradient region is 1/20 or more and 1/3 or less of the thickness of the piezoelectric layer.

This piezoelectric element has a good thickness of the lead concentration gradient region and good durability characteristics and a large displacement.

APPLICATION EXAMPLE 7

A liquid ejecting head according to an embodiment of the present invention includes the piezoelectric element described in any one of application examples 1 to 6, a vibrating plate with flexibility which is provided in contact with the first conductive layer or the second conductive layer, and a pressure chamber communicated with a nozzle orifice and changed in volume by an operation of the piezoelectric element.

This liquid ejecting head includes the piezoelectric element of the above-described application example and is thus excellent in durability.

APPLICATION EXAMPLE 8

A liquid ejecting apparatus according to an embodiment of the present invention includes the liquid ejecting head described in application example 7.

This liquid ejecting apparatus includes the liquid ejecting head of the above-described application example and is thus excellent in durability.

BRIEF DESCRIPTION OF THE DRAWINGS

The invention will be described with reference to the accompanying drawings, wherein like numbers reference like elements.

DESCRIPTION OF EXEMPLARY EMBODIMENTS

A preferred embodiment of the present invention is described with reference to the drawings. The embodiment described below is made for explaining an example of the present invention. In addition, the invention is not limited to the embodiment and includes various modified examples carried out within the scope of the gist.

1. Piezoelectric Element

Figure 1:
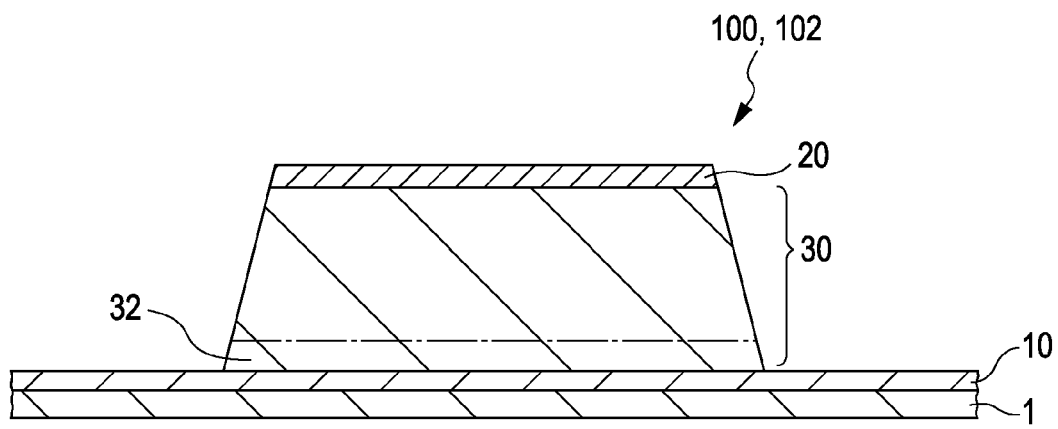
FIG. 1 is a schematic sectional view of a piezoelectric element according to an embodiment of the invention.

FIG. 1 is a schematic sectional view of a piezoelectric element 100 according to an embodiment of the invention.

The piezoelectric element 100 according to the embodiment includes a first conductive layer 10, a second conductive layer 20, and a piezoelectric layer 30.

1.1. First Conductive Layer

The first conductive layer 10 is formed on, for example, a substrate 1. The substrate 1 can be made of a flat plate composed of, for example, a conductor, a semiconductor, or an insulator. The substrate 1 may have a single-layer structure or a structure including a plurality of laminated layers. The internal structure of the substrate 1 is not limited as long as the top surface has a planar shape and, for example, a structure having a space formed therein may be used. For example, as in a liquid ejecting head described below, when a pressure chamber and the like are formed below the substrate 1, the substrate 1 and a plurality of members formed below the substrate 1 may be collectively regarded as one substrate 1.

The substrate 1 may be a vibrating plate with flexibility which can be deformed (bent) by an operation of the piezoelectric layer 30. In this case, the piezoelectric element 100 serves as a piezoelectric actuator 102 including the vibrating plate, the first conductive layer 10, the piezoelectric layer 30, and the second conductive layer 20. The expression "the substrate 1 with flexibility" represents that the substrate 1 can be bent. When the substrate 1 is the vibrating plate, bending of the substrate 1 which is enough to change the volume of the pressure chamber to the same extent as the volume of liquid to be ejected is sufficient for the piezoelectric actuator 102 to be used in a liquid ejecting head.

When the substrate 1 is the vibrating plate, the material of the substrate 1 can be exemplified by inorganic oxides such as zirconium oxide ($ZrO_2$), silicon nitride, silicon oxide, and the like, and alloys such as stainless steel and the like. Among these materials, zirconium oxide is particularly preferred for the material of the substrate 1 (vibrating plate) from the viewpoint of chemical stability and rigidity. In this case, the substrate 1 may have a laminated structure including two or more of the exemplified materials.

In this embodiment, the case in which the substrate 1 is the vibrating plate and is composed of zirconium oxide is described as an example. Therefore, the piezoelectric element 100 is substantially the same as the piezoelectric actuator 102 including the vibrating plate with flexibility which can be deformed (bent) by an operation of the piezoelectric layer 30. Therefore, in the description below, the piezoelectric element 100 and the piezoelectric actuator 102 can be replaced with each other.

The shape of the first conductive layer 10 is not limited as long as it can be opposed to the second conductive layer 20. However, when the piezoelectric element 100 includes a thin film, a layer or a thin film is preferred. In this case, the thickness of the first conductive layer 10 can be, for example, 50 nm or more and 300 nm or less. Also, the planar shape of the first conductive layer 10 is not particularly limited as long as the piezoelectric layer 30 can be disposed between the first conductive layer 10 and the second conductive layer 20 when both layers are opposed to each other. For example, a rectangular shape, a circular shape, or the like can be used.

One of the functions of the first conductive layer 10 is to serve as one (e.g., a lower electrode formed below the piezoelectric layer 30) of the electrodes used for applying a voltage to the piezoelectric layer 30. The first conductive layer 10 may be provided with the function to control crystal orientation when the piezoelectric layer 30 is crystallized.

The material of the first conductive layer 10 can be exemplified by various metals such as nickel, iridium, platinum, and the like; conductive oxides thereof (e.g., iridium oxide and the like); strontium-ruthenium compound oxides (Sr-$RuO_x$: SRO); lanthanum-nickel compound oxides ($LaNiO_x$: LNO); and the like. The first conductive layer 10 may have a single-layer structure using one of the exemplified materials or a laminated structure using two or more. In addition, for example, an adhesive layer or the like may be formed between the first conductive layer 10 and the substrate 1. In this case, for example, a titanium layer or the like can be used as the adhesive layer.

1.2. Second Conductive Layer

The second conductive layer 20 is disposed to face the first conductive layer 10. The second conductive layer 20 may be entirely or partially opposed to the first conductive layer 10. The shape of the second conductive layer 20 is not limited as long as it can be opposed to the first conductive layer 10. However, when the piezoelectric element 100 includes a thin film, a layer or a thin film is preferred. In this case, the thickness of the second conductive layer 20 can be, for example, 10 nm or more and 300 nm or less. Also, the planar shape of the second conductive layer 20 is not particularly limited as long as the piezoelectric layer 30 can be disposed between the first conductive layer 10 and the second conductive layer 20 when both layers are opposed to each other. For example, a rectangular shape, a circular shape, or the like can be used.

One of the functions of the second conductive layer 20 is to serve as one (e.g., an upper electrode formed on the piezoelectric layer 30) of the electrodes used for applying a voltage to the piezoelectric layer 30. The material of the second conductive layer 20 may be the same as the first conductive layer 10.

FIG. 1 shows an example in which the first conductive layer 10 is formed to have a larger planar size than the second conductive layer 20. However, the second conductive layer 20 may be formed to have a larger planar size than the first conductive layer 10. In this case, the second conductive layer 20 may be formed on the side surface of the piezoelectric layer 30 so that the second conductive layer 20 can also be provided with the function to protect the piezoelectric layer 30 from moisture, hydrogen, and the like.

1.3. Piezoelectric Layer

The piezoelectric layer 30 is disposed between the first conductive layer 10 and the second conductive layer 20. The piezoelectric layer 30 may be in contact with at least one of the first conductive layer 10 and the second conductive layer 20. In addition, another layer may be formed between the piezoelectric layer 30 and at least one of the first conductive layer 10 and the second conductive layer 20. In this case, examples of the other layer include an orientation control layer (e.g., a titanium layer) for controlling the crystal orientation of the piezoelectric layer 30 and the like.

In the example shown in FIG. 1, the piezoelectric layer 30 is provided in contact with the first conductive layer 10 and the second conductive layer 20. The thickness of the piezoelectric layer 30 can be, for example, 100 nm or more and 2000 nm or less. When the thickness of the piezoelectric layer 300 is out of this range, sufficient deformation (electro-mechanical conversion) may not be obtained.

In addition, the piezoelectric layer 30 contains a compound oxide containing at least lead, zirconium, titanium, and oxygen. Examples of the compound oxide contained in the piezoelectric layer 30 include oxides represented by the general formula $ABO_3$ (for example, A contains Pb, and B contains Zr and Ti). More specifically, lead zirconate titanate (Pb(Zr, Ti)$O_3$) (may be abbreviated as "PZT" hereinafter), lead zirconate titanate niobate (Pb(Zr, Ti, Nb)$O_3$) (may be abbreviated as "PZTN" hereinafter), and the like can be used. Any one of these compound oxides can form a solid solution of A-site oxide and B-site oxide in the formula. Further, these compound oxides can take a perovskite crystal structure by crystallization. When the compound oxides take a perovskite crystal structure by crystallization, piezoelectricity can be exhibited. As a result, the piezoelectric layer 30 can be deformed by applying an electric field to the first conductive layer 10 and the second conductive layer 20 (electro-mechanical conversion). This deformation permits, for example, bending and vibration of the substrate 1.

The piezoelectric layer 30 includes a lead concentration gradient region 32. The lead concentration gradient region 32 is a region in which the lead concentration increases from the first conductive layer side to the second conductive layer side.

A lead concentration in the piezoelectric layer 30 is measured by analysis in the thickness direction. The analysis in the thickness direction is performed by, for example, Auger spectroscopy analysis (AES), energy dispersive X-ray spectroscopy with a scanning transmission electron microscope (STEM-EDS), electron energy loss analysis with a transmission electron microscope (STEM-EELS, TEM-EELS, or the like), X-ray photoelectron spectroscopy (XPS), secondary ion mass spectrometry (SIMS), or the like. The concentration is indicated as a concentration profile (depth profile) in the thickness direction of the piezoelectric layer 30. In order to enhance quantitatively of analysis in the thickness direction, Rutherford backscattering spectroscopy (RBS) is combined according to demand.

The expression "the lead concentration increases from the first conductive layer side to the second conductive layer side" represents that at least the lead concentration on the first conductive layer side of the lead concentration gradient region 32 of the piezoelectric layer 30 is lower than that on the second conductive layer side of the lead concentration gradient region 32. In other words, the lead concentration gradient region 32 has different lead concentrations at both sides in the thickness direction, and the lead concentration on the second conductive layer side is higher than that on the first conductive layer side.

The difference in lead concentration between the first conductive layer side of the lead concentration gradient region 32 and the second conductive layer side of the lead concentration gradient region 32 is more preferably higher by 0.8 atomic % or more and 1.8 atomic % or less than that on the first conductive layer side of the lead concentration gradient region 32 because the crystal quality is further improved over the whole of the piezoelectric layer 30.

In the lead concentration gradient region 32, the lead concentration may increase from the first conductive layer side to the second conductive layer side either in a monotonous manner or a stepwise manner. The increasing manner of the lead concentration further includes the case in which there is a portion in which the lead concentration decreases from the first conductive layer side to the second conductive layer side, and the case in which the lead concentration increases on average from the first conductive layer side to the second conductive layer side. In addition, a depth profile may be a profile superposed with noise or the like, but a leveled profile can be obtained by averaging or filtering. The increasing manner also includes the case in which in a profile after such processing, the lead concentration increases from the first conductive layer side to the second conductive layer side.

In this embodiment, as shown in FIG. 1, the lead concentration gradient region 32 is disposed on the first conductive layer side of the piezoelectric layer 30. In addition, in this embodiment, the lead concentration gradient region 32 is formed in contact with the first conductive layer 10. Therefore, in this embodiment, in the piezoelectric layer 30, the lead concentration increases from at least the side of the first conductive layer 10, i.e., the first conductive layer 10 side of the lead concentration gradient region 32, to the second conductive layer 20 side of the lead concentration gradient region 32.

The thickness of the lead concentration gradient region 32 is not particularly limited but can be 5 nm or more and 2,000 nm or less. The thickness of the lead concentration gradient region 32 may be the same as the piezoelectric layer 30. Namely, the lead concentration may increase from the first conductive layer 10 side to the second conductive layer 20 side over the whole of the piezoelectric layer 30. In addition, the thickness of the lead concentration gradient region 32 is preferably 1/20 or more and 1/3 or less of the thickness of the piezoelectric layer 30. When the lead concentration gradient region 32 has a thickness in this range, both the durability and displacement of the piezoelectric element 100 can be improved.

Further, the lead concentration gradient in the thickness direction of the lead concentration gradient region 32 is more preferably 0.006 atomic %/nm or more and 0.014 atomic %/nm or less. In this case, the durability of the piezoelectric element 100 can be further improved.

1.4. Operation, Advantage, Etc.

The piezoelectric element 100 of this embodiment includes the lead concentration gradient region 32 formed on the first conductive layer side of the piezoelectric layer 30. Therefore, crystallinity of the compound oxide is improved over the whole of the piezoelectric layer 30. In addition, the 100 crystal direction of the piezoelectric material is easily oriented in parallel with the thickness direction of the piezoelectric layer 30. As a result, a displacement of the piezoelectric element 100 can be increased, and the operation characteristics can be improved. Since the piezoelectric element 100 of this embodiment has good crystallinity in the piezoelectric layer 30, durability in repeated driving can be improved.

1.5. Modified Example

The piezoelectric element 100 of this embodiment can be modified as follows.

Figure 2:
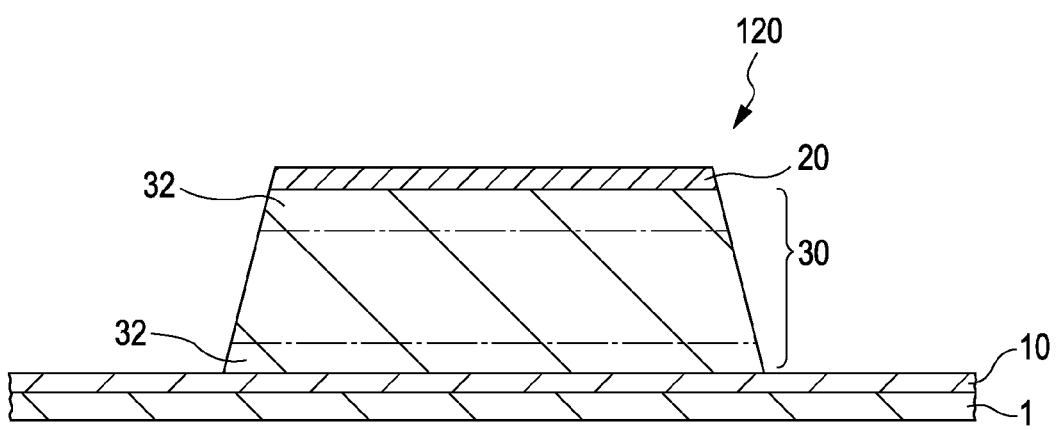
FIG. 2 is a schematic sectional view of a piezoelectric element according to a modified example.

FIG. 2 is a schematic sectional view of a piezoelectric element 120 according to a modified example. The piezoelectric element 120 is the same as the above-mentioned piezoelectric element 100 except that two lead concentration gradient regions 32 are formed in the piezoelectric layer 30, and one of the lead concentration gradient regions 32s is disposed on the second conductive layer 20 side. Therefore, detailed description of members other than the piezoelectric layer 30 is omitted.

The piezoelectric layer 30 of the piezoelectric element 120 includes the two lead concentration gradient regions 32 in which the lead concentration increases from the first conductive layer 10 side to the second conductive layer 20 side. The details of the lead concentration gradient regions 32 are the same as in the above-described embodiment. In addition, in the piezoelectric element 120, one of the lead concentration gradient regions 32 is disposed on the first conductive layer 10 side of the piezoelectric layer 30 like in the above-described embodiment, and the other lead concentration gradient region 32 is disposed on the second conductive layer 20 side of the piezoelectric layer 30.

In the piezoelectric element 120 of this modified example, the two lead concentration gradient regions 32s are formed, and thus crystallinity of the compound oxide is further improved over the entirety of the piezoelectric layer 30. In addition, the 100 crystal direction of the piezoelectric material is more easily oriented in parallel with the thickness direction of the piezoelectric layer 30. As a result, a displacement of the piezoelectric element 120 can be further increased, and the operation characteristics can be improved. Since the piezoelectric element 120 of the modified example has good crystallinity in the piezoelectric layer 30, durability in repeated driving can be further improved.

2. Method for Manufacturing Piezoelectric Element

The piezoelectric element of the present invention can be manufactured, for example, as described below.

First, the substrate 1 is prepared, and the first conductive layer 10 is formed on the substrate 1. The first conductive layer 10 can be formed by, for example, sputtering, plating, vacuum evaporation, or the like. The first conductive layer 10 can be patterned according to demand.

Next, the piezoelectric layer 30 is formed on the first conductive layer 10. The piezoelectric layer 30 can be formed by, for example, a sol-gel method, a CVD (Chemical Vapor Deposition) method, a MOD (Metal Organic Deposition) method, a sputtering method, a laser abrasion method, or the like. For example, when the material of the piezoelectric layer 30 is PZT, the piezoelectric layer 30 can be crystallized by firing at about 650° C. to 750° C. in an oxygen atmosphere. The crystallization may be performed after patterning of the piezoelectric layer 30. Further, the piezoelectric layer 30 may be formed by repeating the above-mentioned operation multiple times. In this case, crystallinity and crystal quality can be improved over the whole of the piezoelectric layer 30.

Next, the second conductive layer 20 is formed on the piezoelectric layer 30. The second conductive layer 20 can be formed by, for example, sputtering, plating, vacuum evaporation, or the like. Then, the second conductive layer 20 and the piezoelectric layer 30 are patterned in a desired shape to form the piezoelectric element. The second conductive layer 20 and the piezoelectric layer 30 can be simultaneously patterned according to demand. The piezoelectric element of the present invention can be manufactured by the above-exemplified process.

3. Experimental Example

The present invention is described in further detail below by experimental examples. The present invention is not limited to the experimental examples described below.

3.1. Formation of Piezoelectric Element

A piezoelectric element of each of the experimental examples was formed as follows. First, a silicon substrate was prepared, and the first conductive layer 10 was formed by sputtering iridium and then patterned. The piezoelectric layer 30 of each of the experimental examples was formed by a sol-gel method. A raw material solution of PZT was applied to the first conductive layer 10 by a spin coating method. The raw material solutions of the experimental examples had different compositions. In addition, spin coating included edge rinsing with a main solvent and was performed at a spin speed of 1,500 rpm.

The applied raw material solution was dried at 100° C. for 3 minutes and 160° C. for 3 minutes in air to remove the solvent. Then, the organic components in the raw material solution were removed (degreased) by heat treatment at 400° C. for 3 minutes in air. In addition, a first layer of the piezoelectric layer composed of PZT was formed by firing at 740° C. for 5 minutes in an oxygen atmosphere. At this time, in each of the experimental examples, the thickness of the first layer after firing was about 130 nm. Then, the same operation was repeated to form the second and latter piezoelectric layers on the first piezoelectric layer. The thickness of the second and latter piezoelectric layers was about 300 nm. As a result, the piezoelectric layer 30 including a total of 5 layers was formed. The overall thickness of the piezoelectric layer 30 was about 1,330 nm.

Then, the second conductive layer 20 was deposited by sputtering iridium, and the second conductive layer 20 and the piezoelectric layer 30 were patterned to form the piezoelectric element of each of Experimental Examples 1 and 2.

The raw material solution used in the sol-gel method was a mixed solution containing lead acetate, $Zr(CH_3COCHCOCH_3)_4$, and $Ti[OCH(CH_3)_2]_4$, and butyl cellosolve was used as a solvent. The composition of the raw material solution of each experimental example is shown as the concentration of an element contained in the raw material solution in the column "Concentration (charge amount) of each element in raw material" in Table 1.

TABLE 1

| | | Experimental Example 1 | Experimental Example 2 | Reference Example |
|---|---|---|---|---|
| Concentration (charging amount) of each element in raw material | Pb | 22.8 | 24.2 | 21.2 |
| | Zr | 10 | 9.8 | 10.2 |
| | Ti | 9.3 | 9.1 | 9.5 |
| | O | 57.9 | 56.8 | 59.1 |

TABLE 1-continued

| | | Experimental Example 1 | Experimental Example 2 | Reference Example |
|---|---|---|---|---|
| Pb excess amount of piezoelectric layer (normalized by stoichiometric ratio) | | 0.18 | 0.28 | 0.08 |
| Concentration of each element on first electrode side of lead concentration gradient region | Pb | 21.6 | 22.4 | 21.6 |
| | Zr | 9.4 | 8.8 | |
| | Ti | 9.3 | 9.1 | |
| | O | 59.8 | 59.3 | |
| Pb excess amount of piezoelectric layer (normalized by stoichiometric ratio) | | 0.16 | 0.25 | |
| Concentration of each element on second electrode side of lead concentration gradient region | Pb | 22.4 | 24.2 | 13.9 |
| | Zr | 11.2 | 11.3 | |
| | Ti | 7.4 | 6.8 | |
| | O | 59.0 | 57.7 | |
| Pb excess amount of piezoelectric layer (normalized by stoichiometric ratio) | | 0.20 | 0.34 | |
| Difference in lead concentration between first conductive layer side and second conductive layer side of lead concentration gradient region | | 0.8 | 1.8 | −7.7 |
| Remarks | | RBS/AES | RBS/AES | STEM-EDS |

In Experimental Example 1, the excess amount of lead atoms in the raw material solution of the piezoelectric layer 30 is 18%. The term "excess amount" represents an excess amount mixed over a lead fraction (concentration) which is regarded as 1 (100%) in the stoichiometric composition, i.e., $Pb(Zr, Ti)O_3$, when PZT takes an ideal perovskite structure. Namely, in Experimental Example 1, the piezoelectric layer 30 is formed using the raw material solution having a number of lead atoms contained which was 18% larger than the total number of Zr atoms and Ti atoms. Similarly, in Experimental Example 2, the excess amount of lead atoms in the raw material solution of the piezoelectric layer 30 is 28%. Hereinafter, the excess amount of Pb atoms in the raw material solution is simply referred to as the "Pb excess amount".

3.2. Lead Concentration Gradient Region

Figure 3:
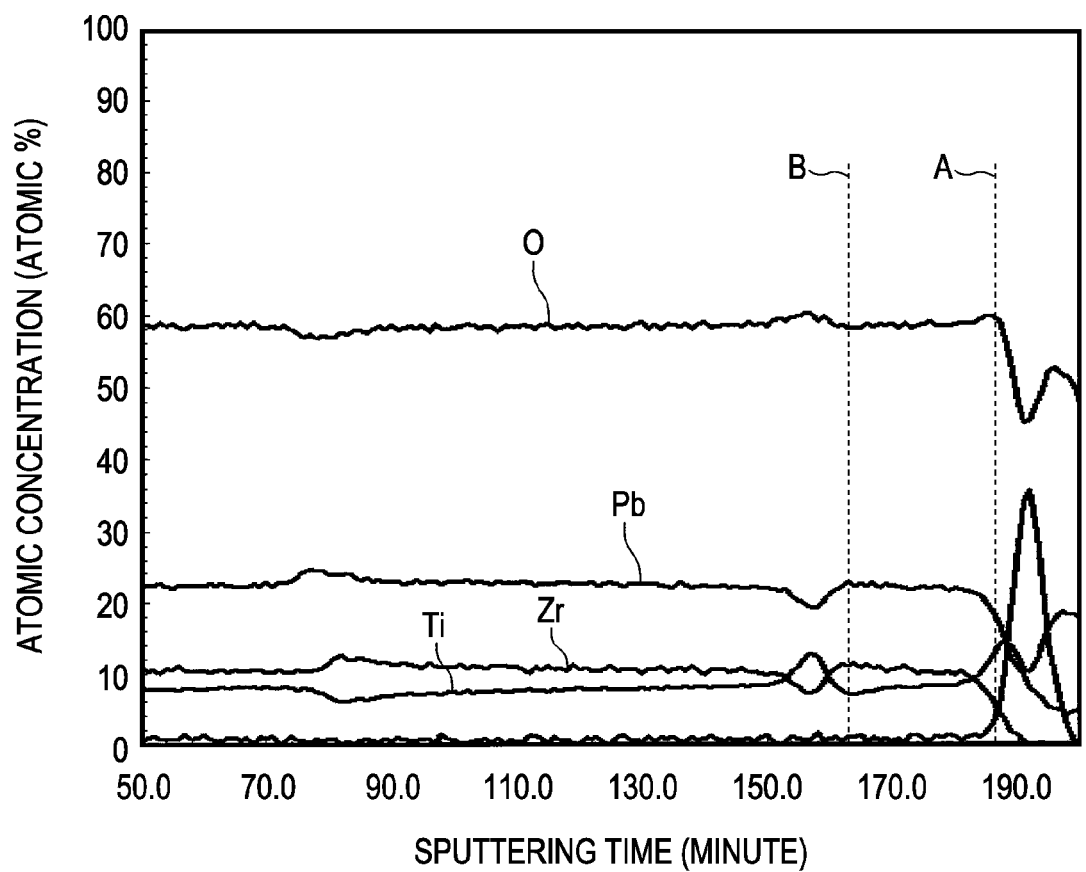
FIG. 3 is a RBS/AES depth profile of Experimental Example 1.
Figure 4:
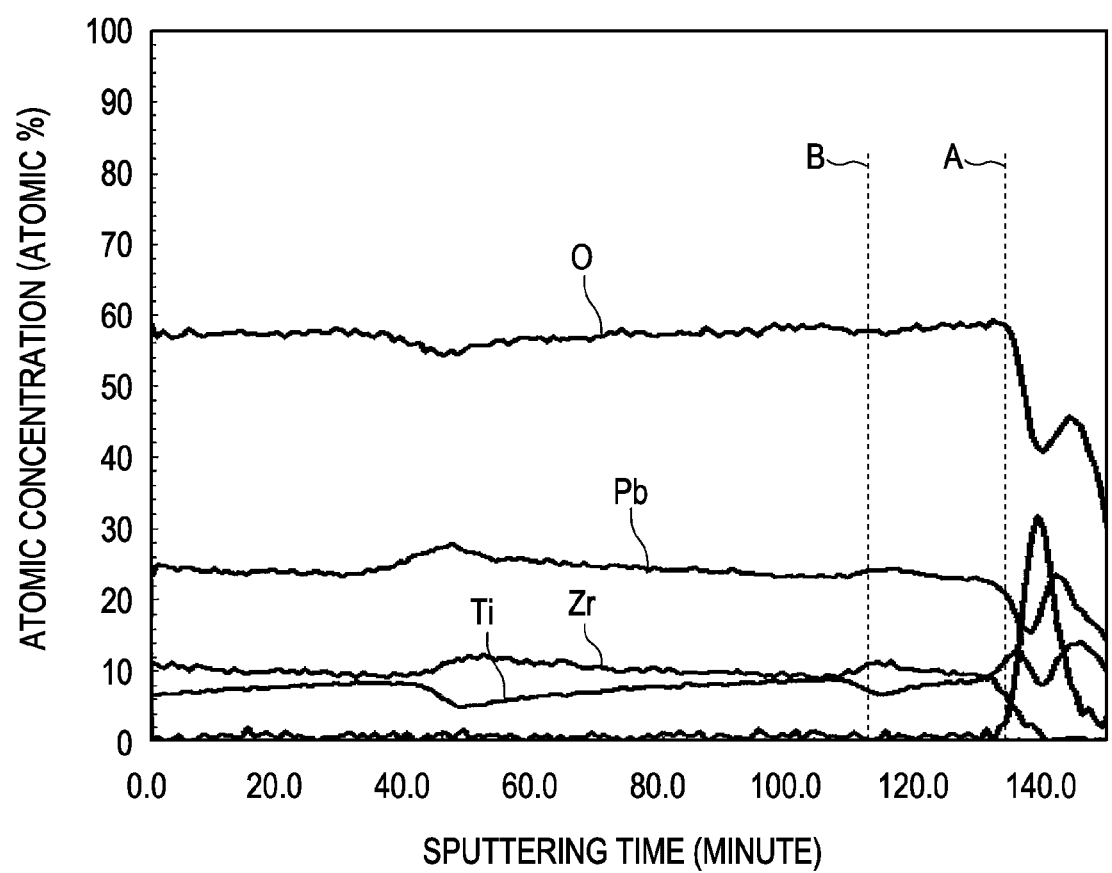
FIG. 4 is a RBS/AES depth profile of Experimental Example 2.

FIGS. 3 and 4 are depth profiles based on the results of RBS (Rutherford Backscattering Spectroscopy)/AES (Auger Electron Spectroscopy) measurement of the vicinities of the interfaces between the first conductive layers 10 and the piezoelectric layers 30 of the piezoelectric elements of Experimental Examples 1 and 2, respectively. The RBS method can produce a quantitative composition distribution in the depth direction without requiring a standard sample. However, it is difficult, only by the RBS method, to measure a thickness (in this electrode configuration, the PZT limit thickness is about 100 nm) and determine a composition distribution near an interface with an electrode. Therefore, in each of the experimental examples, a relative sensitivity factor is determined by combination of AES with high depth resolution and RBS with high quantitative accuracy so that both the abscissa (depth resolution) and the ordinate (quantitative accuracy) are satisfied. The relative sensitivity factor is a value normalized with respect to an average peak intensity of an AES stable region (little influence of selective etching) and a composition ratio determined by RBS. This method cannot determine a composition profile using each of the elements alone but requires the peak intensities and relative sensitivity factors of all elements, thereby producing a relative concentration profile. A concentration profile in the depth direction of a PZT thick film (about 500 nm) was determined by applying the relative sensitivity factors determined for PZT near the interface between the first conductive layer 10 and the piezoelectric layer 30 on the basis of the following equation 1:

Concentration of element $A$=(peak intensity of element $A$/relative sensitivity factor)/$\Sigma$(peak intensity of each element/relative sensitivity factor)×100 (1)

On the basis of the resulting profiles (FIGS. 3 and 4), the composition was measured at a distance of 5 nm (denoted by symbol A in the drawings) and a distance of 130 nm (denoted by symbol B in the drawings) to the piezoelectric layer 30 side from the interface between the first conductive layer 10 and PZT (the piezoelectric layer 30) in the piezoelectric element of each of Experimental Examples 1 and 2. These measurements correspond to the compositions at the positions on the first conductive layer side of the lead concentration gradient region 32 and the second conductive layer side of the lead concentration gradient region 32. Namely, the PZT composition was measured at the bottom (side) and the top (side) of the first layer of the piezoelectric layer 30. These values are shown in the columns of Experimental Example 1 and Experimental example 2 of Table 1.

The results shown in Table 1 indicate that in both Experimental Examples 1 and 2, the lead concentration gradient region 32 has Pb, Zr, and Ti concentration gradients in the thickness direction, and the Pb and Zr concentrations are lower on the first conductive layer side, while the reverse is true for the Ti concentration. It is also found that the composition ratio of PZT changes in the thickness direction according to the concentration (charging amount) of each element in the raw material solution. Further, a comparison between the Pb excess amount of 18% (Experimental Example 1) and the Pb excess amount of 28% (Experimental Example 2) indicates that as the Pb excess amount increases from 18% to 28%, any one of the Pb, Zr, Ti concentration gradients becomes steep.

Further, in Experimental Example 1, the lead concentration on the first conductive layer side of the lead concentration gradient region 32 is 21.6 atomic %, and the lead concentration on the second conductive layer side of the lead concentration gradient region 32 is 22.4 atomic %. Therefore, the lead concentration on the second conductive layer side of the lead concentration gradient region 32 is higher by 0.8 atomic % than the lead concentration on the first conductive layer side of the lead concentration gradient region 32. In addition, in Experimental Example 2, the lead concentration on the first conductive layer side of the lead concentration gradient region 32 is 22.4 atomic %, and the lead concentration on the second conductive layer side of the lead concentration gradient region 32 is 24.2 atomic %. Therefore, the lead concentration on the second conductive layer side of the lead concentration gradient region 32 is higher by 1.8 atomic % than the lead concentration on the first conductive layer side of the lead concentration gradient region 32.

Figure 5:
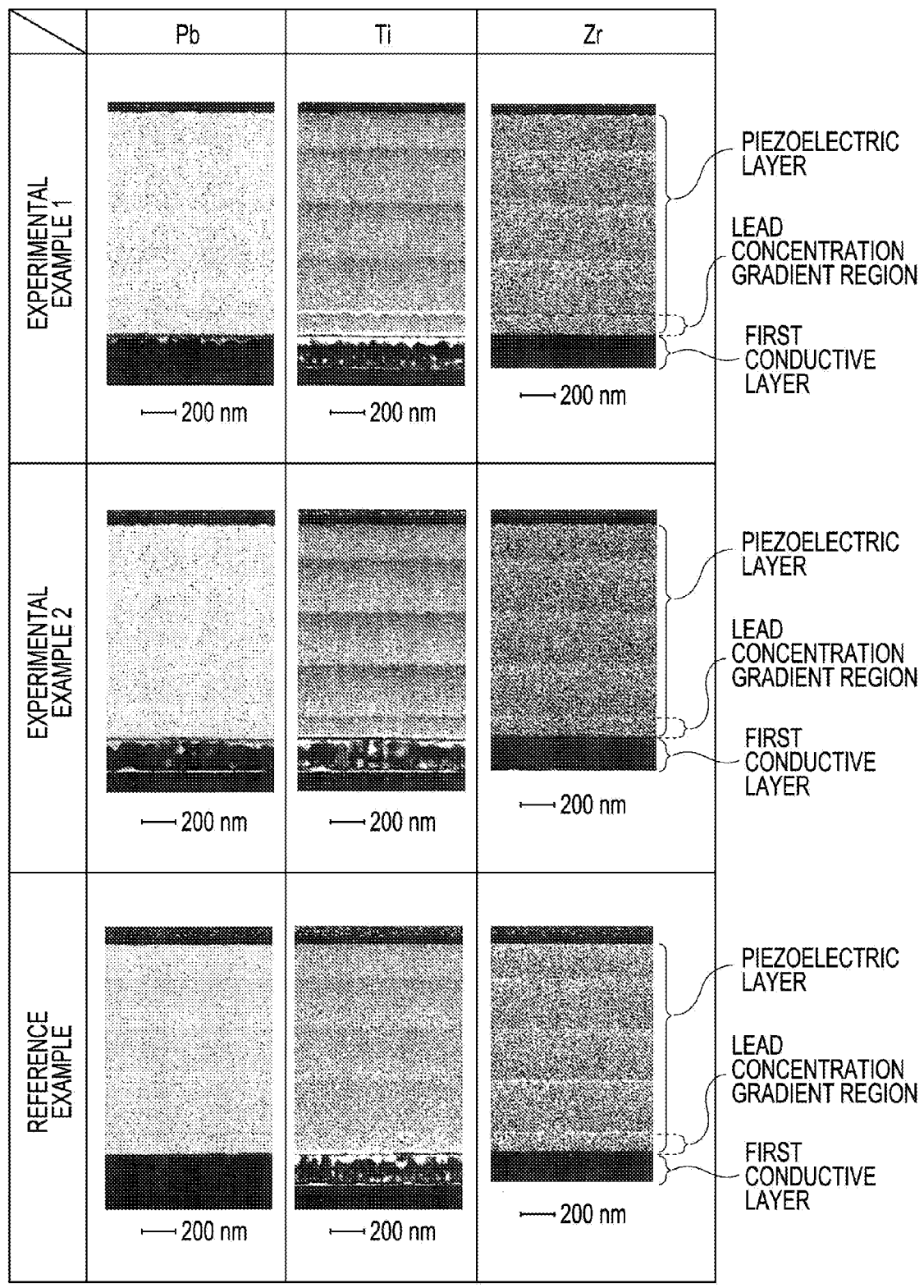
FIG. 5 is a STEM-EDS map image showing sectional compositions of experimental examples and a reference example.

FIG. 5 shows the results obtained by STEM (Scanning Transmission Electron Microscope)-EDS (Energy Dispersive X-Ray Spectroscopy) measurement of sections of the piezoelectric layers 30 of the piezoelectric elements of Experimental Example 1 and Experimental Example 2. Therefore, FIG. 5 shows sectional composition map images for each element. According to the results shown in FIG. 5, in Experimental Example 1 and Experimental Example 2, gradation is clearly observed in the sectional composition map images of Ti and Zr. The results indicate that a periodic concentration distribution occurs in the PZT fired layers. The possible reason for the Pb concentration gradient of PZT (the concentration is lower on the first conductive layer 10 (the lower side of the map image) side) is that excessively supplied Pb diffuses into the first conductive layer 10. It is found that the rate of diffusion increases as the Pb excess amount increases.

Figure 6:
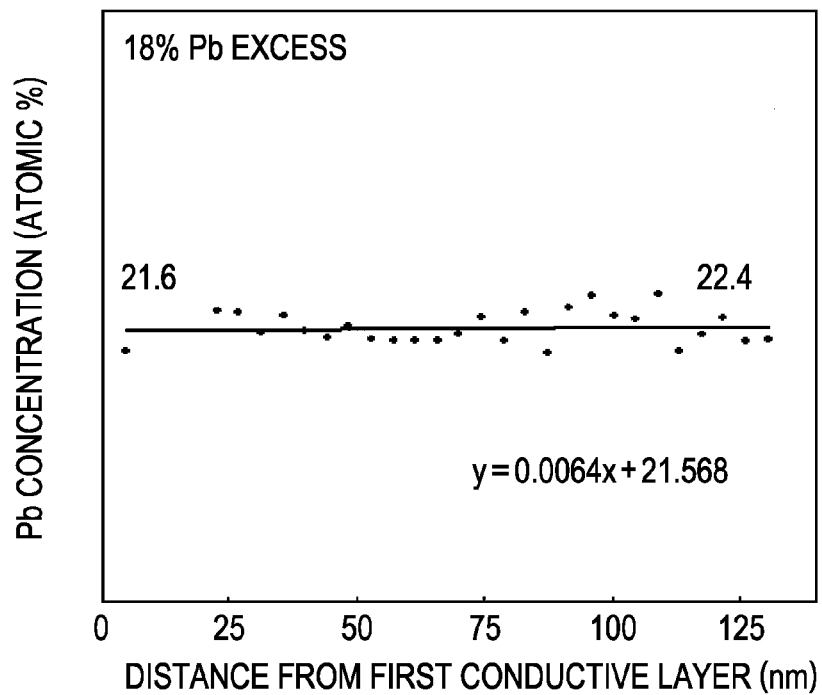
FIG. 6 is a STEM-EDS profile of a sectional composition of Experimental Example 1.
Figure 7:
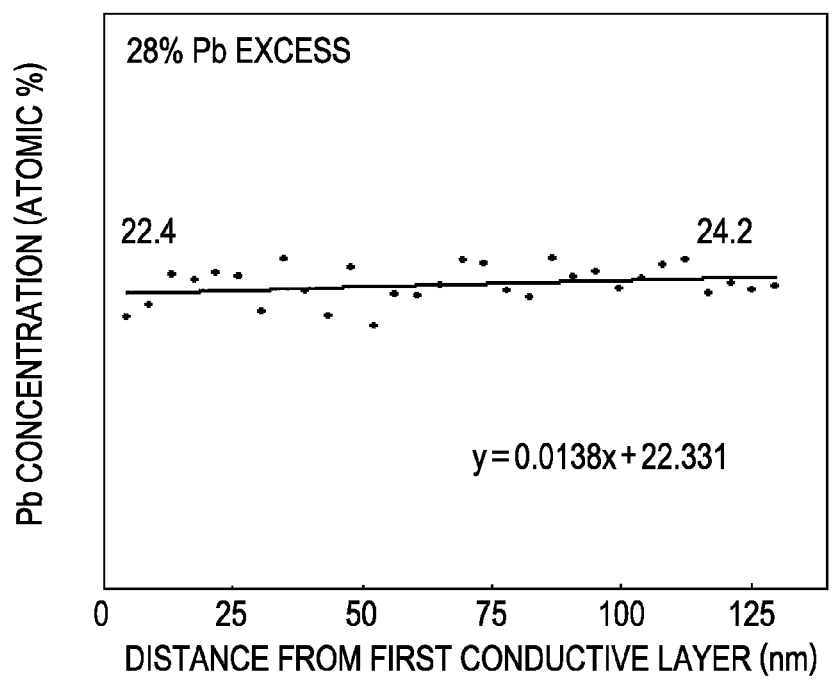
FIG. 7 is a STEM-EDS profile of a sectional composition of Experimental Example 2.

FIGS. 6 and 7 show the results of STEM-EDS observation of the piezoelectric elements of Experimental Example 1 and Experimental Example 2, respectively, for determining a Pb concentration profile between distances 5 nm and 130 nm to the piezoelectric layer 30 side from the interface between the first conductive layer 10 and the piezoelectric layer 30. The quantitatively of EDS is corrected on the basis of the quantitative values determined by RBS/AES. FIG. 6 shows that with the Pb excess amount of 18% (Experimental Example 1), the Pb concentration decreases from 22.4 atomic % to 21.6 atomic % toward the first conductive layer 10, and the rate of change is 0.8 atomic %/130 nm (approximate gradient of 0.0062 atomic %/nm). In addition, FIG. 7 shows that with the Pb excess amount of 28% (Experimental Example 2), the Pb concentration decreases from 24.2 atomic % to 22.4 atomic % toward the lower electrode, and the rate of change is 1.8 atomic %/130 nm (approximate gradient of 0.014 atomic %/nm).

3.3. Evaluation of Piezoelectric Element

Figure 8:
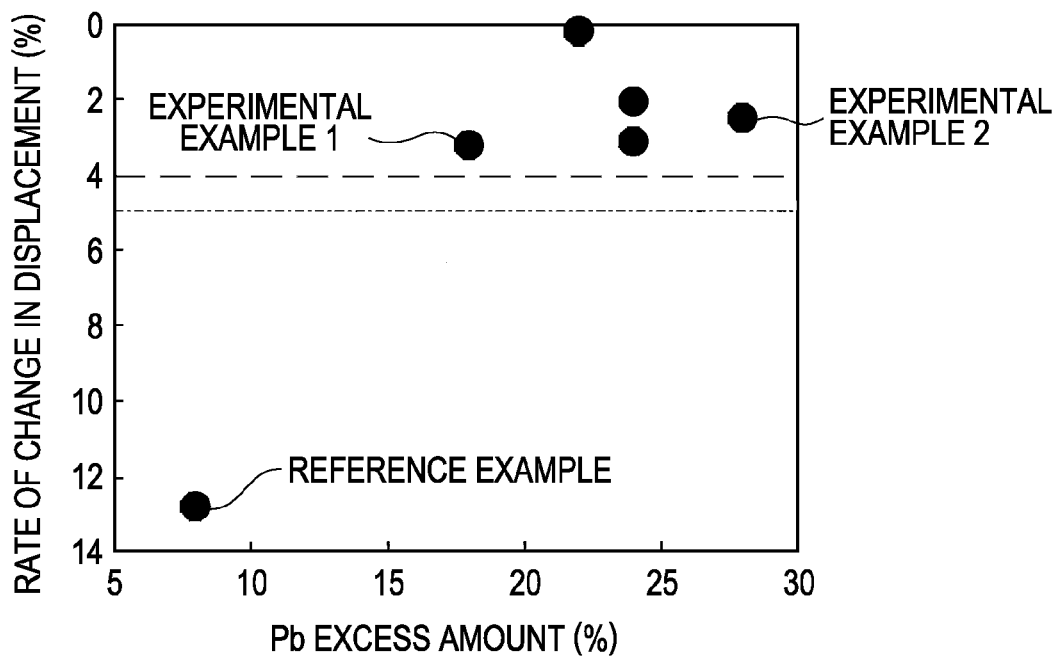
FIG. 8 is a graph showing a relation between Pb excess amounts and rates of change in displacement.

FIG. 8 shows a relation between Pb excess amounts and rates of change in displacement. This relation was made by plotting, against the Pb excess amounts, the rates of change in displacement determined after 100 million applications of a pulse (rectangular wave from −2 V to +30 V when the first conductive layer 10 was set at a plus potential, and the second conductive layer 20 was set at a minus potential) relative to the displacement immediately after the formation of the piezoelectric element. With a lower rate of change, the piezoelectric element is considered to have higher durability. FIG. 8 indicates that the rate of change is suppressed to 4% or less within the range of the Pb excess amount of at least 18% or more (denoted by Experimental Example 1 in FIG. 8). It is also found that with the Pb excess amount of 28% in Experimental Example 2, the rate of change is suppressed to 3% or less. For example, when a rate of change of 5% is regarded as a standard value, it is found that within the range of the Pb excess amount of 18% or more, the standard can be sufficiently satisfied.

3.4 Reference Example

A piezoelectric element with a Pb excess amount of 8% was formed as a reference example. The piezoelectric element of the reference example was formed by the same method as the piezoelectric elements of the experimental examples except that a charge amount (composition of the raw material solution) was changed.

Figure 9:
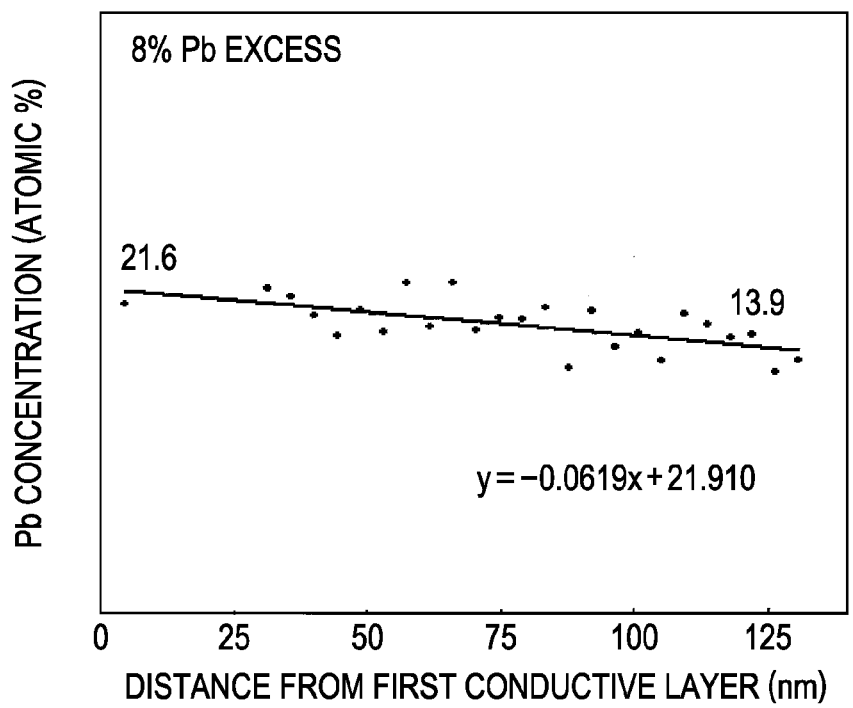
FIG. 9 is a STEM-EDS profile of a sectional composition of Reference Example.

FIG. 9 shows the results of STEM-EDS observation of the piezoelectric element of the reference example, for determining the Pb concentration profile between distances 5 nm and 130 nm to the piezoelectric layer 30 side from the interface between the first conductive layer 10 and the piezoelectric layer 30. A STEM-EDS sectional composition map image of each element of the reference example is also shown in FIG. 5.

The results shown in FIG. 9 indicate that in the piezoelectric element of the reference example, the concentration gradients are reversed as compared with Experimental Example 1 (Pb excess amount=18%) and Experimental Example 2 (Pb excess amount=28%). In the reference example, the Pb concentration increases from 13.9 atomic % to 21.6 atomic % toward the first conductive layer 10, and when a direction away from the first conductive layer 10 is regarded as a positive direction, the rate of change is −7.7 atomic %/130 nm (approximate gradient of −0.059 atomic %/nm). Also, it is thought that in the reference example, Pb diffusion into the first conductive layer 10 is not produced, but segregation of $ZrO_2$ (relative dielectric constant of about 50) without Pb solid solution is observed at the interfaces of the fired layers (the layers formed by each time of firing of the piezoelectric layer 30). Further, segregation of rutile-type $TiO_2$ (relative dielectric constant of about 100) without Pb solid solution is observed at the interface between the first conductive layer 10 and the piezoelectric layer 30. These results possibly represent that a Pb-deficient state is creased due to the lower Pb concentration in PZT than the stoichiometric composition (20 atomic %).

Figure 10:
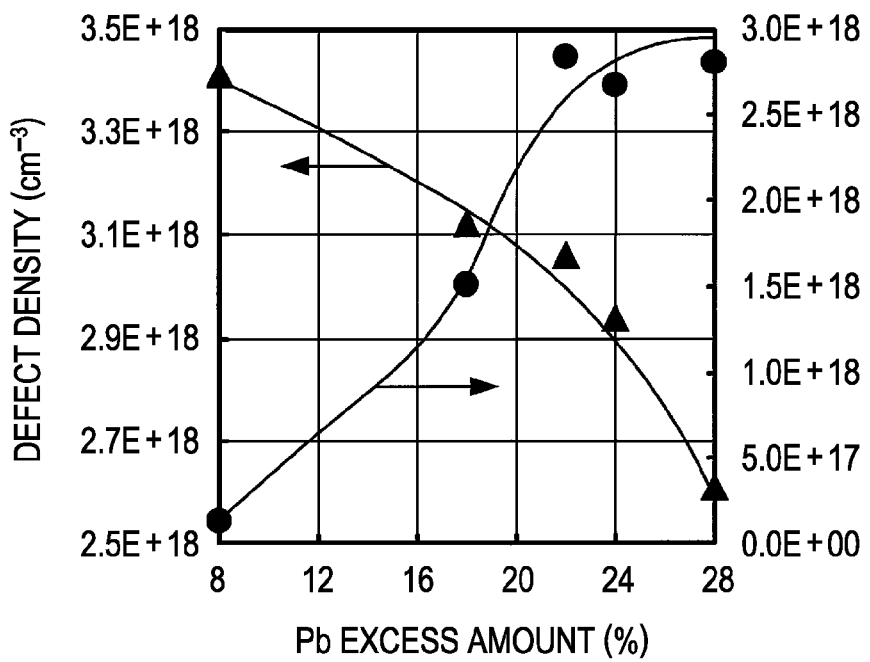
FIG. 10 is a graph showing a relation between Pb excess amounts and crystal defects.

FIG. 10 shows a relation between the Pb excess amounts and crystal defects. This figure shows that the Pb vacancy defect density (defect level 1.2 eV) (the left-side axis in the figure) is decreased by increasing the Pb excess amount, while excess Pb compound defects (present as PbO, defect level 2.3 eV) (the right-side axis in the figure) is saturated with the Pb excess amount of about 22% or more. These results indicate that an increase in Pb vacancy defects is possibly involved as one reason for a high rate of change with the Pb excess amount of 8% (shown by Reference Example in FIG. 8) in FIG. 8.

Figure 11:
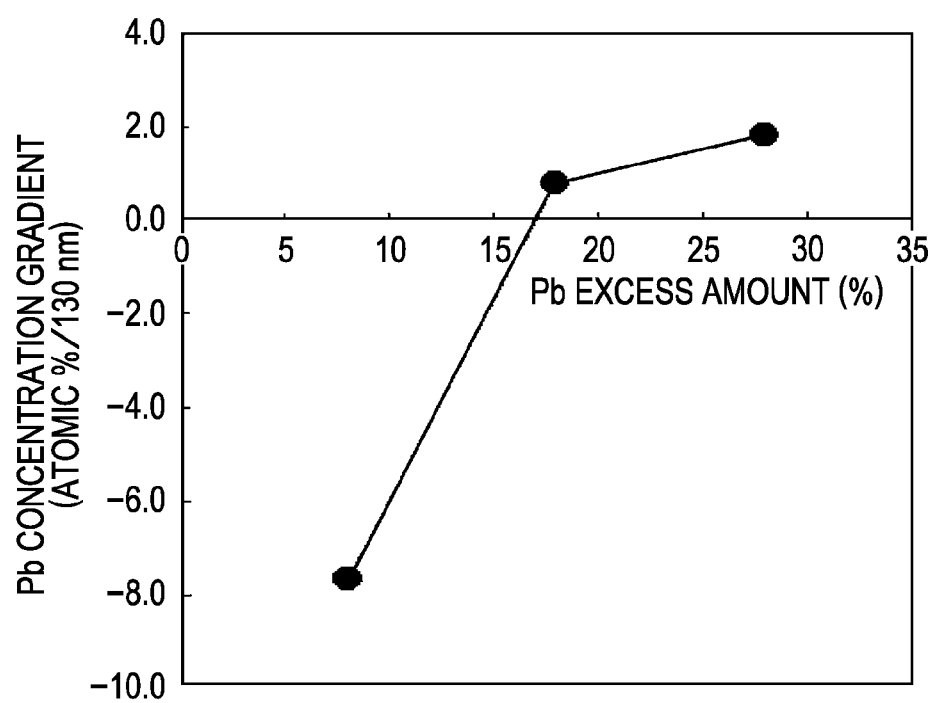
FIG. 11 is a graph showing a relation between Pb excess amounts and Pb concentration gradients.

FIG. 11 shows a relation between Pb excess amounts and Pb concentration gradients. The threshold value of reversal from the Pb concentration gradient which increases in a direction away from the first conductive layer 10 (toward the second conductive layer 20) to that decreases in the direction is at a Pb excess amount of about 16%. In a region of Pb excess amounts smaller than this threshold value, as in the reference example shown in FIG. 8, deterioration resistance (durability) is undesirable. When the Pb excess amount as the threshold value is converted to a rate of change on the basis of FIG. 8, the standard of the rate of change can be estimated as 5%/100 million pulse drives or less. In this case, from the viewpoint of reliability, good performance can be maintained.

In the experimental examples and the reference example, in order to examine durability, the lead concentration and the concentration gradient in the lead concentration gradient region 32 were changed by changing the Pb excess amount. The conditions of the lead concentration gradient region 32 can be changed by changing the firing temperature, interposing another layer such as a titanium layer or the like, or changing the material of the first conductive layer 10 and the second conductive layer 20.

The piezoelectric element of the present invention does not depend on the conditions for forming the lead concentration gradient region 32. Namely, even when the piezoelectric layer 30 is formed by any method, the piezoelectric element of the present invention can exhibit the above-described operation and advantage since the piezoelectric layer 30 has the lead concentration gradient region 32.

4. Liquid Ejecting Head

Figure 12:
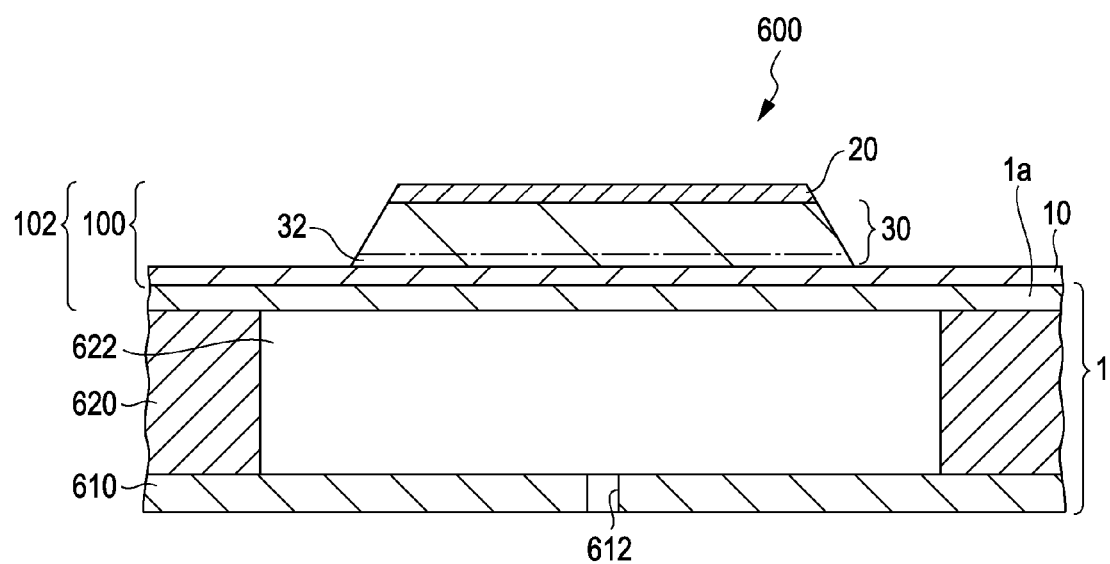
FIG. 12 is a schematic sectional view of a principal portion of a liquid ejecting head according to an embodiment of the invention.
Figure 13:
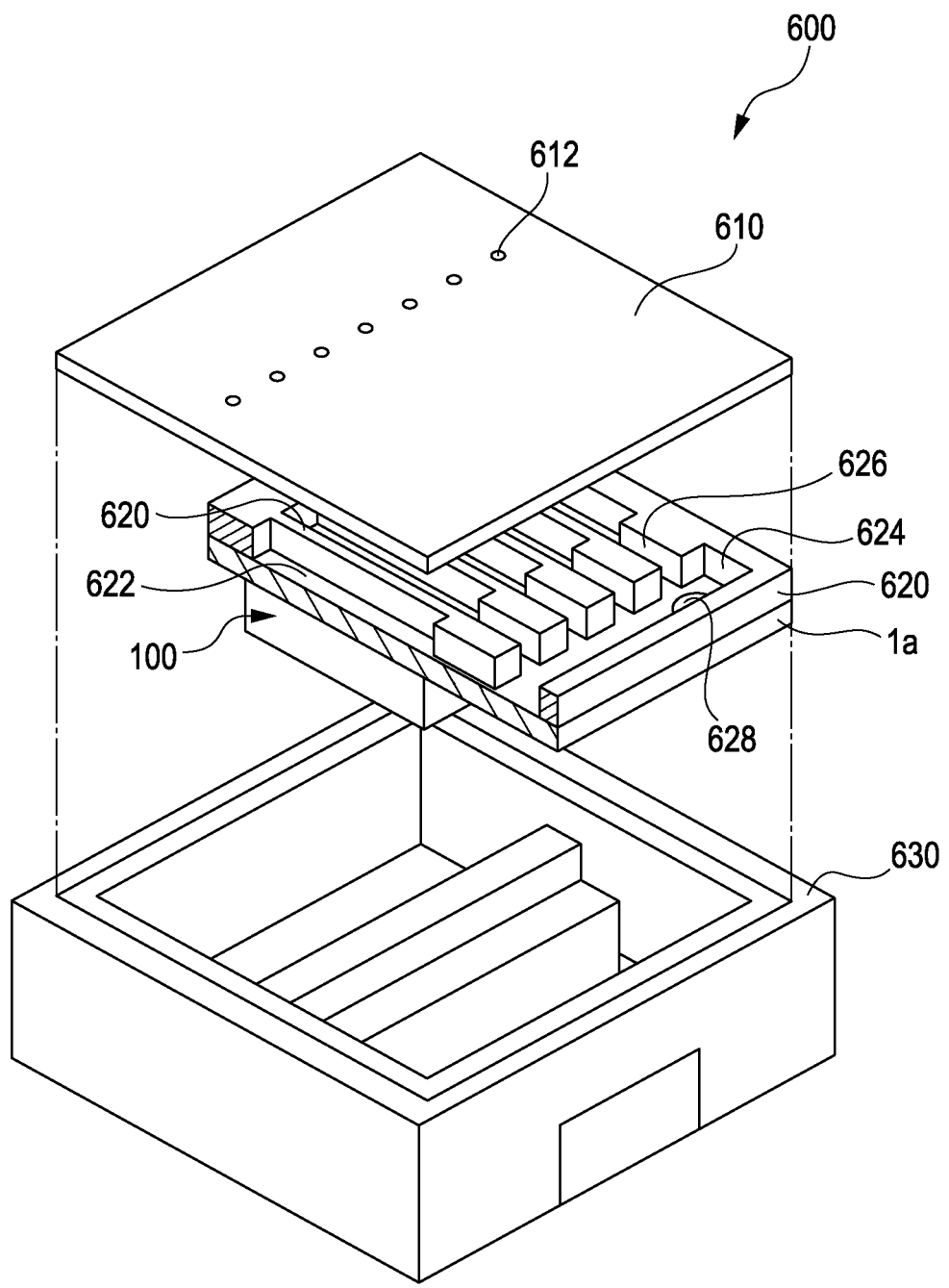
FIG. 13 is an exploded perspective view schematically showing a liquid ejecting head according to an embodiment of the invention.

Next, a liquid ejecting head 600 including the piezoelectric element according to the present invention which functions as a piezoelectric actuator is described with reference to the drawings. FIG. 12 is a schematic sectional view of a principal portion of the liquid ejecting head 600. FIG. 13 is an exploded perspective view showing the liquid ejecting head 600 in an upside-down state of normal operation.

The liquid ejecting head 600 can include the above-described piezoelectric element (piezoelectric actuator). In an example below, the liquid ejecting head 600 is described, in which the piezoelectric element 100 is formed on the substrate 1 (structure including an upper portion serving as a vibrating plate 1a) to serve as the piezoelectric actuator 102.

As shown in FIGS. 12 and 13, the liquid ejecting head 600 includes a nozzle plate 610 having nozzle orifices 612, a pressure chamber substrate 620 for forming pressure chambers 622, and the piezoelectric element 100. As shown in FIG. 13, the liquid ejecting head 600 can further include a casing 630. In FIG. 13, the piezoelectric element 100 is simplified.

The nozzle plate 610, as shown in FIGS. 12 and 13, includes the nozzle orifices 612. An ink can be ejected from the nozzle orifices 612. In the nozzle plate 610, for example, many nozzle orifices 612 are provided in a line. As the material of the nozzle plate 610, for example, silicon, stainless steel (SUS), or the like can be used.

The pressure chamber substrate 620 is provided on the nozzle plate 610 (below the nozzle plate 610 in the example shown in FIG. 13). The material of the pressure chamber substrate 620 can be exemplified by silicon or the like. The space between the nozzle plate 610 and the vibrating plate 1a is partitioned by the pressure chamber substrate 620 to provide a reservoir (liquid storing portion) 624, supply ports 626 communicated with the reservoir 624, and the pressure chambers 622 communicated with the supply ports 626 as shown in FIG. 13. In other words, the reservoir 624, the supply ports 626, and the pressure chambers 622 are partitioned by the nozzle plate 610, the pressure chamber substrate 620, and the vibrating plate 1a. The reservoir 624 can temporarily store the ink supplied from the outside (e.g., an ink cartridge) through a through hole 628 provided in the vibrating plate 1a. The ink in the reservoir 624 can be supplied to the pressure chambers 622 through the supply ports 626. The pressure chambers 622 are changed in volume by deformation of the vibrating plate 1a. The pressure chambers 622 are communicated with the nozzle orifices 612 so that the ink or the like is ejected from the nozzle orifices 612 by changes in volume of the pressure chambers 622.

The piezoelectric element 100 is provided on the pressure chamber substrate 620 (in the example shown in FIG. 13, below the pressure chamber substrate 620). The laminated structure of the piezoelectric element 100 is electrically connected to a piezoelectric element driving circuit (not shown) so as to permit operations (vibration, deformation) on the basis of signals from the piezoelectric element driving circuit. The vibrating plate 1a is deformed by the operation of the piezoelectric element 100 (the piezoelectric layer 30) so that the pressure in the pressure chambers 622 can be appropriately changed.

As shown in FIG. 13, the casing 630 can house the nozzle plate 610, the pressure chamber plate 620, and the piezoelectric element 100. As the material of the casing 630, for example, a resin, a metal, or the like can be used.

The liquid ejecting head 600 includes the piezoelectric element 100 having the piezoelectric layer 30 with good crystallinity. Therefore, the liquid ejecting head 600 has high durability.

The case in which the liquid ejecting head 600 is an ink jet recording head is described above. However, the liquid ejecting head of the present invention can also be used as a colorant ejecting head used for producing color filters of a liquid crystal display and the like, an electrode material ejecting head used for forming electrodes of an organic EL display, FED (surface emission display), and the like, a bio-organic ejecting head used for producing bio-chips, and the like.

5. Liquid Ejecting Apparatus

Figure 14:
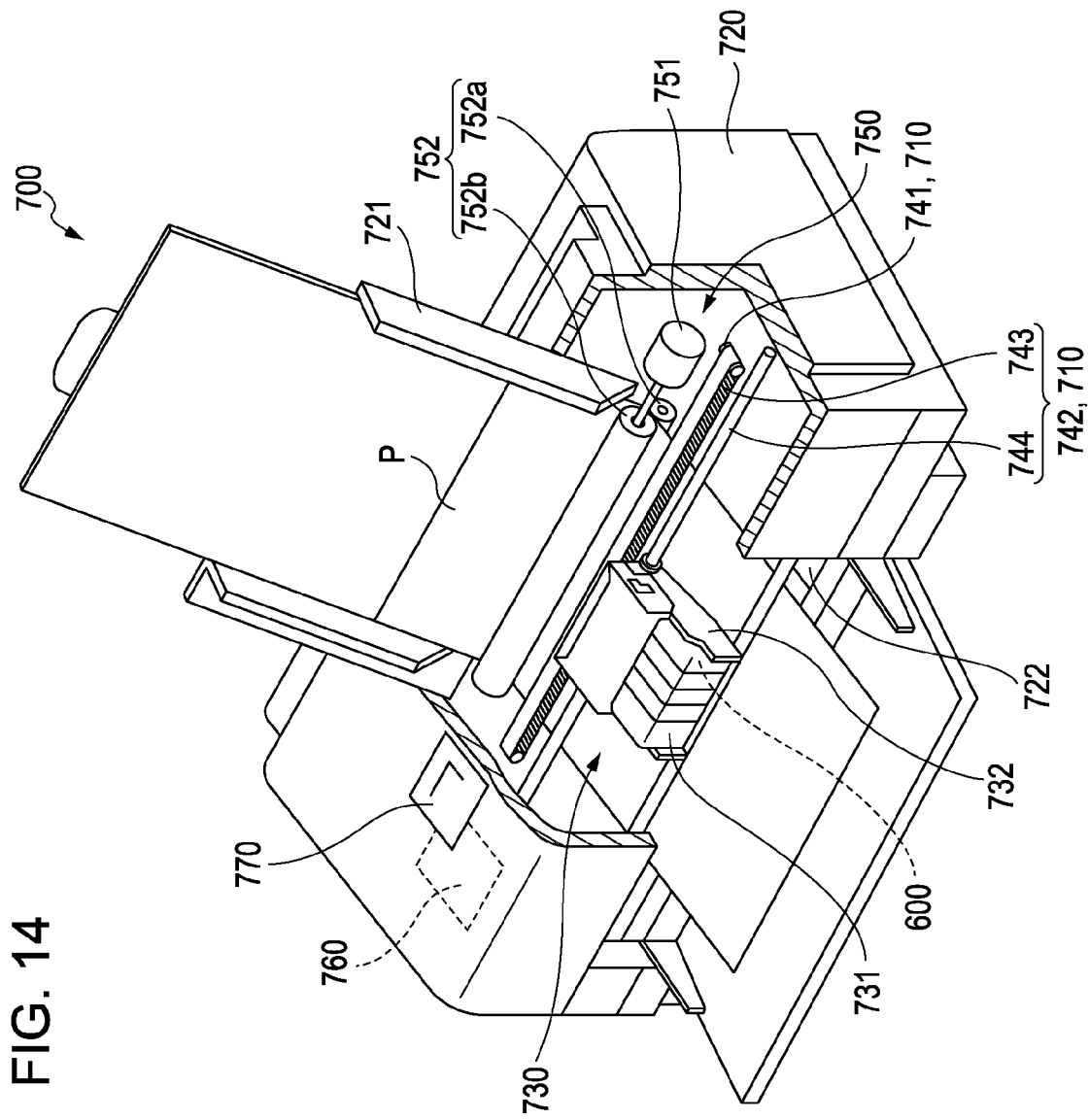
FIG. 14 is a perspective view schematically showing a liquid ejecting apparatus according to an embodiment of the invention.

Next, a liquid ejecting apparatus according to an embodiment of the present invention is described with reference to the drawing. FIG. 14 is a perspective view schematically showing a liquid ejecting apparatus 700 according to an embodiment of the invention. The liquid ejecting apparatus 700 includes the liquid ejecting head according to the present invention. Hereinafter, the case in which the liquid ejecting apparatus 700 is an ink jet printer including the above-described liquid ejecting head 600 is described.

As shown in FIG. 14, the liquid ejecting apparatus 700 includes a head unit 730, a driving portion 710, and a control portion 760. The liquid ejecting apparatus 700 may further include an apparatus body 720, a paper feed portion 750, a tray 721 on which recording paper P is placed, a discharge port 722 through which the recording paper P is discharged, and an operation panel 770 disposed on the upper surface of the apparatus body 720.

The head unit 730 includes an ink jet recording head (simply referred to as a "head" hereinafter) including the above-described liquid ejecting head 600. The head unit 730 is further provided with an ink cartridge 731 which supplies ink to the head and a carriage 732 on which the head and the ink cartridge 731 are mounted.

The driving portion 710 can reciprocate the head unit 730. The driving portion 710 includes a carriage motor 741 serving as a driving source of the head unit 730 and a reciprocating mechanism 742 which receives rotation of the carriage motor 740 to reciprocate the head unit 730.

The reciprocating mechanism 742 includes a carriage guide shaft 744 with both ends supported by a frame (not shown) and a timing belt 743 extended in parallel with the carriage guide shaft 744. The carriage guide shaft 744 supports the carriage 732 so that the carriage 732 can freely reciprocate. Further, the carriage 732 is fixed to a portion of the timing belt 743. When the timing belt 743 is traveled by operating the carriage motor 741, the head unit 730 reciprocates by being guided by the carriage guide shaft 744. During the reciprocation, ink is appropriately ejected from the head to perform printing on the recording paper P.

The control portion 760 can control the head unit 730, the driving portion 710 and the paper feed portion 750.

The paper feed portion 750 can transfer the recording paper P from the tray 721 to the head unit 730. The paper feed portion 750 includes a paper feed motor 751 serving as a driving source and a paper feed roller 752 which rotates by operation of the paper feed motor 751. The paper feed roller 752 is provided with a driven roller 752a and a driving roller 752b which are opposed to each other with a feed passage of the recording paper P provided therebetween. The driving roller 752b is connected to the paper feed motor 751. When the paper feed portion 750 is driven by the control portion 760, the recording paper P is transferred to pass below the head unit 730.

The head unit 730, the driving portion 710, the control portion 760, and the paper feed portion 750 are provided in the apparatus body 720.

The liquid ejecting apparatus 700 includes the liquid ejecting head 600 with high durability. Therefore, the liquid ejecting apparatus 700 has high reliability.

Although the ink jet recording apparatus 700 serving as an ink jet printer is described as an example of the liquid ejecting apparatus according to the present invention, the liquid ejecting apparatus according to the present invention can also be industrially used. In this case, as a liquid (liquid material) to be ejected, various functional materials with viscosity appropriately adjusted with a solvent or a dispersion medium can be used. Besides image recording apparatuses such as the above-described printer and the like, the liquid ejecting apparatus according to the present invention can be preferably used as a colorant ejecting apparatus used for producing color filters of a liquid crystal display and the like, a liquid material ejecting apparatus used for forming electrodes and color filters of an organic EL display, FED (surface emission display), an electrophoretic display, and the like, a bio-organic material ejecting apparatus used for producing bio-chips, and the like.

The above-mentioned embodiment and modified examples are only examples, and the present invention is not limited to these. For example, two or more of the above-mentioned embodiment and modified examples can be appropriately combined.

The present invention is not limited to the above-mentioned embodiment, and various modifications can be made. For example, the present invention includes substantially the same configuration (for example, a configuration having the same function, method, and results or a configuration having the same object and advantage) as the configuration described in the embodiment. Also, the present invention includes a configuration in which an unessential portion of the configuration described in the embodiment is replaced by another. Further, the present invention includes a configuration in which the same operation and advantage as the configuration described in the embodiment are exhibited or the same object can be achieved. Further, the present invention includes a configuration in which a known technique is added to the configuration described in the embodiment.

What is claimed is:

1. A piezoelectric element comprising:
   a first conductive layer;
   a second conductive layer disposed to face the first conductive layer; and
   a piezoelectric layer disposed between the first conductive layer and the second conductive layer and composed of a compound oxide containing at least lead, zirconium, titanium, and oxygen,
   wherein the piezoelectric layer includes a lead concentration gradient region in which the lead concentration increases from the first conductive layer side to the second conductive layer side; and
   the lead concentration gradient region is disposed on the first conductive layer side of the piezoelectric layer,
   wherein the lead concentration in the piezoelectric layer is measured using a relative sensitivity factor determined by both Rutherford backscattering spectroscopy and Auger electron spectroscopy.

2. A piezoelectric element comprising:
   a first conductive layer;
   a second conductive layer disposed to face the first conductive layer, wherein the first conductive layer is formed to have a larger planer area than the second conductive layer; and
   a piezoelectric layer disposed between the first conductive layer and the second conductive layer and composed of a compound oxide containing at least lead, zirconium, titanium, and oxygen,
   wherein the piezoelectric layer includes two lead concentration gradient regions in which the lead concentration increases from the first conductive layer side to the second conductive layer side; and
   one of the lead concentration gradient regions is disposed on the first conductive layer side of the piezoelectric layer, and the other lead concentration gradient region is disposed on the second conductive layer side of the piezoelectric layer such that piezoelectric layer is disposed between the first and second lead concentration gradient regions, wherein the lead concentration in the piezoelectric layer is measured using a relative sensitivity factor determined by both Rutherford backscattering spectroscopy and Auger electron spectroscopy.

3. The piezoelectric element according to claim 1, wherein the difference in lead concentration between the first conductive layer side of the lead concentration gradient region and the second conductive layer side of the lead concentration gradient region is 0.8 atomic % or more and 1.8 atomic % or less.

4. The piezoelectric element according to claim 1, wherein the lead concentration gradient in the lead concentration gradient region is 0.006 atomic %/nm or more and 0.014 atomic %/nm or less.

5. The piezoelectric element according to claim 1, wherein the lead concentration gradient region has a layer shape, and the thickness of the lead concentration gradient region is 1/20 or more and 1/3 or less of the thickness of the piezoelectric layer.

6. A liquid ejecting head comprising:
the piezoelectric element according to any one of claims 1 to 4;
a vibrating plate with flexibility which is provided in contact with the first conductive layer or the second conductive layer; and
a pressure chamber communicated with a nozzle orifice and changed in volume by an operation of the piezoelectric element.

7. A liquid ejecting apparatus comprising the liquid ejecting head according to claim 6.

* * * * *